(12) United States Patent
Wang et al.

(10) Patent No.: US 11,600,606 B2
(45) Date of Patent: Mar. 7, 2023

(54) LED DISPLAY UNIT GROUP WITH COMMON A-ELECTRODE PADS AND DISPLAY PANEL

(71) Applicant: FOSHAN NATIONSTAR OPTOELECTRONICS CO., LTD., Foshan (CN)

(72) Inventors: Junyong Wang, Foshan (CN); Qiang Zhao, Foshan (CN); Kuai Qin, Foshan (CN); Heng Guo, Foshan (CN); Feng Gu, Foshan (CN); Danwei Li, Foshan (CN); Bin Zhao, Foshan (CN); Hongwen Chen, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 101 days.

(21) Appl. No.: 17/218,389

(22) Filed: Mar. 31, 2021

(65) Prior Publication Data
US 2021/0305221 A1    Sep. 30, 2021

(30) Foreign Application Priority Data
Mar. 31, 2020  (CN) .......................... 202010247531.6

(51) Int. Cl.
  *H01L 25/075*   (2006.01)
  *H01L 33/62*    (2010.01)
(52) U.S. Cl.
  CPC .......... *H01L 25/0753* (2013.01); *H01L 33/62* (2013.01)

(58) Field of Classification Search
  CPC ........................... H01L 25/0753; H01L 33/62
  See application file for complete search history.

(56) References Cited

U.S. PATENT DOCUMENTS

| 2015/0221619 | A1  | 8/2015  | Rhee |
| 2019/0285943 | A1  | 9/2019  | Liu et al. |
| 2020/0083420 | A1* | 3/2020  | Gu ...................... H01L 23/5384 |
| 2021/0055596 | A1* | 2/2021  | Wu ......................... G09G 3/20 |
| 2021/0398954 | A1* | 12/2021 | Gu .......................... H01L 33/62 |

FOREIGN PATENT DOCUMENTS

| CN | 108831903 A | 11/2018 |
| CN | 109411455 A | 3/2019 |
| CN | 209297663 U | 8/2019 |

OTHER PUBLICATIONS

Translated Chinese Office Action, dated Jun. 16, 2021. Pages 1-6.

\* cited by examiner

*Primary Examiner* — Tracie Y Green
(74) *Attorney, Agent, or Firm* — George McGuire

(57) ABSTRACT

Provided are a LED display unit group and a display panel. The LED display unit group includes a circuit board and pixel units arranged in an array of m rows and n columns on the circuit board. The circuit board includes N metal line layers stacked in sequence and an insulating plate located between adjacent metal line layers. The N metal line layers are electrically connected through a conductive via on the insulating plate, where N≥2. Each pixel unit includes at least two LED light-emitting chips with different light-emitting colors, where m≥2, n≥2. The first metal line layer includes m common A-electrode pads, multiple A-electrode pads and multiple B-electrode pads.

19 Claims, 4 Drawing Sheets

LED DISPLAY UNIT GROUP WITH COMMON A-ELECTRODE PADS AND DISPLAY PANEL

CROSS-REFERENCE TO RELATED APPLICATION

This application claims priority to Chinese Patent Application No. 202010247531.6 filed Mar. 31, 2020, the disclosure of which is incorporated herein by reference in its entirety.

TECHNICAL FIELD

The present disclosure relates to the field of light-emitting diode (LED) display technology and in particular, to a LED display unit group and a display panel.

BACKGROUND

With the development of display technologies, the indoor small-spacing LED display screen has become the main technology expending space in the future. The pixel unit density of the indoor small-spacing LED display screen needs to meet increasingly high requirements, that is, the pixel unit spacing is required to be as small as possible.

As the number of light-emitting units integrated in the small-spacing LED display screen increases, more metal pads, conductive leads and pins need to be provided, causing the subsequent welding to be difficult and the PCB wiring to be more complicated.

The structure of the traditional LED display unit group cannot achieve both increasing the integration level of the small-spacing LED and improving the circuit stability of the small-spacing LED.

SUMMARY

In view of this, the present disclosure provides a LED display unit group and a display panel, which solves the problem in the existing art that increasing the integration level of the small-spacing LED and improving the circuit stability of the LED display unit group cannot be both achieved.

In a first aspect, the present disclosure provides a LED display unit group. The LED display unit group includes a circuit board and pixel units arranged in an array of m rows and n columns on the circuit board.

The circuit board includes N metal line layers stacked in sequence and an insulating plate located between adjacent metal line layers, and the N metal line layers are electrically connected through conductive vias in the insulating plate, where N≥2.

Each of the pixel units includes at least two LED light-emitting chips with different light-emitting colors, and the at least two LED light-emitting chips are fixed on a first metal line layer of the N metal line layers, where m≥2, and n≥2.

The first metal line layer includes m common A-electrode pads, a plurality of A-electrode pads and a plurality of B-electrode pads; the plurality of A-electrode pads are in one-to-one correspondence with A-electrodes of all LED light-emitting chips; the plurality of B-electrode pads are in one-to-one correspondence with B-electrodes of all the LED light-emitting chips; and all A-electrode pads in the pixel units in each row are electrically connected to a respective one of the m common A-electrode pads.

The A-electrode pads corresponding to LED light-emitting chips with a same light-emitting color in the pixel units in a same row are disposed to be bilaterally symmetric about a central axis of the circuit board in a vertical direction, and the B-electrode pads corresponding to the LED light-emitting chips with the same light-emitting color in the pixel units in the same row are disposed to be bilaterally symmetric about the central axis of the circuit board in the vertical direction.

In an embodiment, an N-th metal line layer of the N metal line layers includes m common A-electrode pins and 3n common B-electrode pins, where each of the m common A-electrode pins is electrically connected to a respective one of the m common A-electrode pads corresponding to A-electrodes of LED light-emitting chips of the pixel units in one row, and each of the 3n common B-electrode pins is electrically connected to respective ones of the plurality of B-electrode pads corresponding to B-electrodes of LED light-emitting chips with a same light-emitting color of the pixel units in one column.

In an embodiment, each of the m common A-electrode pins is located between two columns of the pixel units and is close to an edge of the LED display unit group.

In an embodiment, connection line directions from an A-electrode to a B-electrode of LED light-emitting chips in two adjacent ones of the pixel units in the same row are opposite.

In an embodiment, each of the m common A-electrode pads is integrally formed with respective ones of the plurality of A-electrode pads.

In an embodiment, the first metal line layer includes m connection parts, each of the m common A-electrode pads is U-shaped and is electrically connected to a respective one of the m connection parts in a same row, and each of the m connection parts is electrically connected to a respective one of the m common A-electrode pins through one of the conductive vias.

In an embodiment, each of the m common A-electrode pads is U-shaped, and a U-shaped opening direction of one of the m common A-electrode pads in a first row of the m rows is opposite to a U-shaped opening direction of one of the m common A-electrode pads in an m-th row of the m rows.

In an embodiment, each of the pixel units includes an LED light-emitting chip with a first light-emitting color, an LED light-emitting chip with a second light-emitting color, an LED light-emitting chip with a third light-emitting color, and three B-electrode pads which are in one-to-one correspondence with the three LED light-emitting chips with different light-emitting colors, where the three B-electrode pads are a first B-electrode pad, a second B-electrode pad and a third B-electrode pad.

In an embodiment, N=4, and a metal trace connecting first B-electrode pads in the pixel units in each column and a metal trace connecting third B-electrode pads in the pixel units in each column are located in a third metal line layer.

In an embodiment, N=4, and a metal trace connecting second B-electrode pads in the pixel units in each column is located in a second metal line layer.

In an embodiment, an insulating plate in contact with the N-th metal line layer is provided with an identifying marker for identifying polarities of the pins.

In an embodiment, the conductive vias electrically connected to B-electrode pads corresponding to the at least two LED light-emitting chips of each of the pixel units are not in a same vertical line.

In a second aspect, the present disclosure further provides a display panel which includes any one of the LED display unit groups described in the first aspect of the present disclosure.

DETAILED DESCRIPTION

Figure 1:
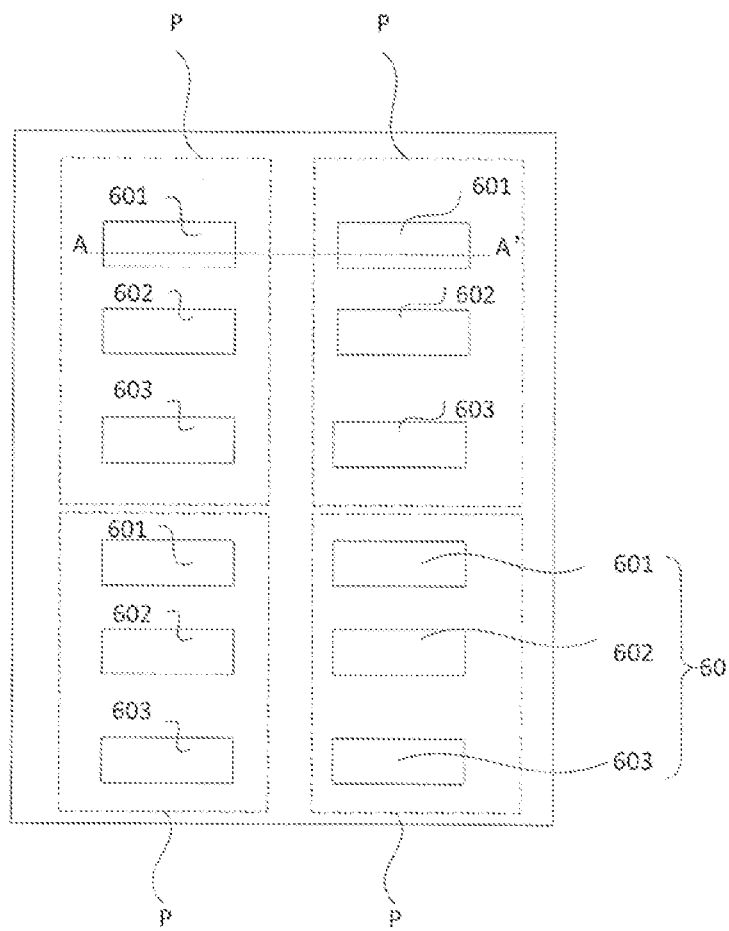
FIG. 1 is a top view of a LED display unit group provided by an embodiment of the present disclosure.

The present disclosure is further described below in detail in conjunction with drawings and embodiments. It is to be understood that the embodiments described herein are merely intended to explain the present disclosure and not to limit the present disclosure. Additionally, it is to be noted that for ease of description, merely part, not all, of the structures related to the present disclosure are illustrated in the drawings.

As described in the above section "BACKGROUND", in the structure of the conventional LED display unit group, since the size of the display unit group is difficult to be further reduced due to being limited by the sizes of the pads and the metal traces, increasing the integration level of the small-spacing LED and improving the circuit stability of the LED display unit group cannot be both achieved.

To solve the above technical problem, embodiments of the present disclosure provide the solutions described below.

The LED display unit group includes a circuit board and pixel units arranged in an array of m rows and n columns on the circuit board. The circuit board comprises N metal line layers stacked in sequence and an insulating plate located between adjacent metal line layers, and the N metal line layers are electrically connected through conductive vias in the insulating plate, wherein N≥2. Each pixel unit comprises at least two LED light-emitting chips with different light-emitting colors, and the at least two LED light-emitting chips are fixed on a first metal line layer of the N metal line layers, wherein m≥2, and n≥2. The first metal line layer comprises m common A-electrode pads, a plurality of A-electrode pads and a plurality of B-electrode pads. The plurality of A-electrode pads are in one-to-one correspondence with A-electrodes of all LED light-emitting chips; the plurality of B-electrode pads are in one-to-one correspondence with B-electrodes of all the LED light-emitting chips; and all A-electrode pads in the pixel units in each row are electrically connected to a respective one of the m common A-electrode pads. The A-electrode pads corresponding to LED light-emitting chips with a same light-emitting color in the pixel units in a same row are disposed to be bilaterally symmetric about a central axis of the circuit board in a vertical direction, and the B-electrode pads corresponding to the LED light-emitting chips with the same light-emitting color in the pixel units in the same row are disposed to be bilaterally symmetric about the central axis of the circuit board in the vertical direction.

Figure 2:
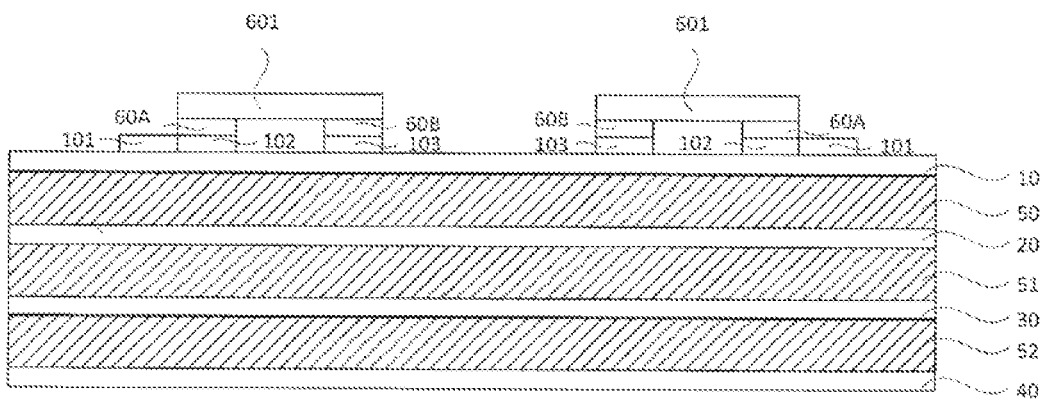
FIG. 2 is a sectional view taken along a line A-A' of FIG. 1.
Figure 3:
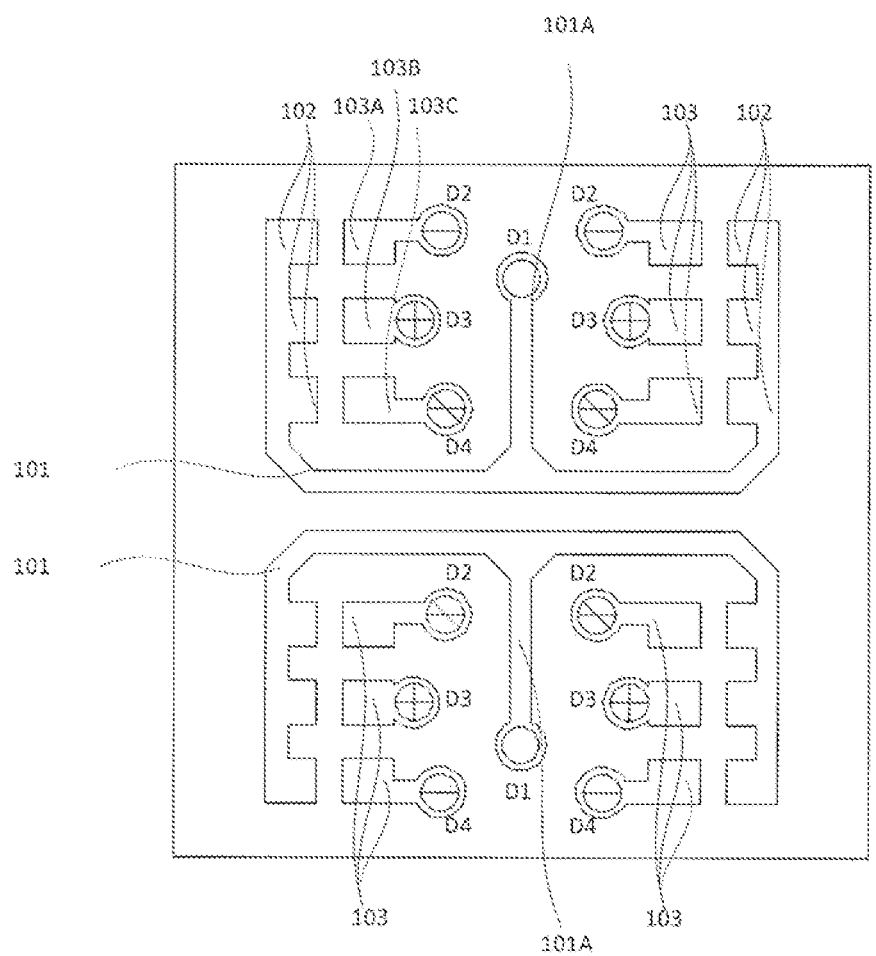
FIG. 3 is a structural view of a first metal line layer provided by an embodiment of the present disclosure.

FIG. 1 is a top view of a LED display unit group provided by an embodiment of the present disclosure. FIG. 2 is a sectional view taken along a line A-A' of FIG. 1. FIG. 3 is a structural view of a first metal line layer provided by an embodiment of the present disclosure.

For ease of description, in the embodiment of the present disclosure, the solution in the embodiment of the present disclosure is described by using an example in which N=4, M=2, N=2, and each pixel unit includes three LED light-emitting chips with different light-emitting colors.

Referring to FIGS. 1, 2 and 3, exemplarily, the circuit board includes four metal line layers stacked in sequence. The four metal line layers are a first metal line layer 10, a second metal line layer 20, a third metal line layer 30, and a fourth metal line layer 40 sequentially arranged from top to bottom. Insulating plates are each disposed between respective two adjacent metal line layers, and the insulating plates are a first insulating plate 50, a second insulating plate 51, and a third insulating plate 52 sequentially arranged from top to bottom. The circuit board may be formed by pressing two independent PCBs. Each PCB includes two metal line layers and an insulating plate between the two metal line layers, another insulating plate is disposed between the two PCBs, and the another insulating plate and the two PCB boards are pressed together to form the circuit board. The four metal line layers are electrically connected by conductive vias (not shown in the figures). The circuit board is provided with four pixel units P arranged in an array of two rows and two columns. Each pixel unit P includes three LED light-emitting chips 60 with different light-emitting colors, i.e., an LED light-emitting chip 601 with a first light-emitting color, an LED light-emitting chip 602 with a second light-emitting color and an LED light-emitting chip 603 with a third light-emitting color. The LED light-emitting chips 60 are fixed on the first metal line layer 10. Each LED light-emitting chip 60 includes an A-electrode 60A and a B-electrode 60B which have opposite polarities. The A-electrode 60A and the B-electrode 60B are electrically connected to the first metal line layer 10. In the embodiment of the present disclosure, the A-electrode 60A may be a cathode of the LED light-emitting chip 60, and the B-electrode 60B may be an anode of the LED light-emitting chip 60. The first metal line layer 10 includes two common A-electrode pads 101, multiple A-electrode pads 102 and multiple B-electrode pads 103. Each A-electrode pad 102 corresponds to an A-electrode 60A of a respective one of the LED light-emitting chips 60, and each B-electrode pad 103 corresponds to a B-electrode 60B of a respective one of the LED light-emitting chips 60. All A-electrode pads 102 in the pixel units P in each row are electrically connected to a corresponding common A-electrode pad 101. The A-electrode pads 102 corresponding to LED light-emitting chips with a same light-emitting color in the pixel units in a same row are disposed to be bilaterally symmetric about a central axis of the circuit board in a vertical direction, and the B-electrode pads 103 corresponding to the LED light-emitting chips with the same light-emitting color in the pixel units in the same row are disposed to be bilaterally symmetric about the central axis of the circuit board in the vertical direction.

In the LED display unit group provided by the embodiment of the present disclosure, the circuit board includes at least two metal line layers stacked in sequence and an insulating plate located between adjacent metal line layers. The at least two metal line layers are electrically connected through conductive vias in the insulating plate. The pixel units P are arranged in an array of at least two rows and two columns on the circuit board. Each pixel unit includes at least two LED light-emitting chips 60 with different light-emitting colors, and the at least two LED light-emitting chips 60 are fixed on the first metal line layer 10. The first metal line layer 10 includes at least two common A-electrode pads 101, multiple A-electrode pads 102 and multiple B-electrode pads 103. The multiple A-electrode pads 102 are in one-to-one correspondence with A-electrodes 60A of all LED light-emitting chips 60; and the multiple B-electrode pads 103 are in one-to-one correspondence with B-electrodes 60B of all the LED light-emitting chips 60. All A-electrode pads 102 in the pixel units in each row are electrically connected to the corresponding common A-electrode pad 101. The A-electrode pads 102 corresponding to LED light-emitting chips 60 with a same light-emitting color in the pixel units in a same row are disposed to be bilaterally symmetric about a central axis of the circuit board in a vertical direction, and the B-electrode pads 103 corresponding to the LED light-emitting chips 60 with the same light-emitting color in the pixel units in the same row are disposed to be bilaterally symmetric about the central axis of the circuit board in the vertical direction. All A-electrode pads 102 in the pixel units in each row are electrically connected to the corresponding common A-electrode pad 101 so that the electric signals required by the A-electrode pads are transmitted to the A-electrode pads through the common A-electrode pad 101, thereby solving the problem in the existing art that the size of the display unit group is difficult to be further reduced due to the limitation of the sizes of the pads and the metal traces, and increasing the integration level of the small-spacing light-emitting LED while ensuring the circuit stability of the LED display unit group.

Figure 4:
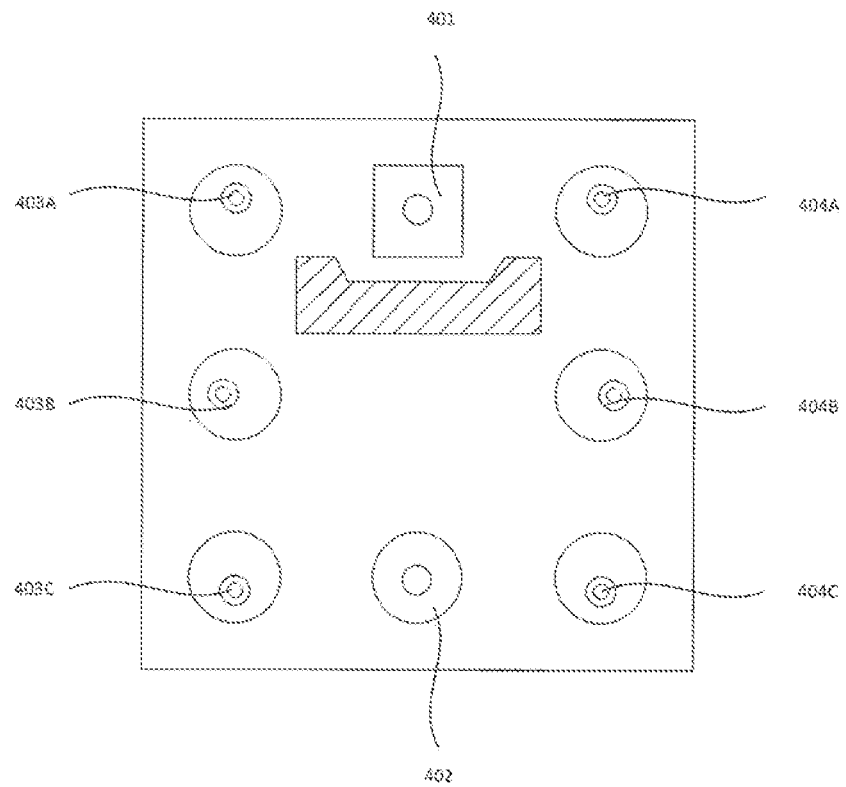
FIG. 4 is a structural view of a fourth metal line layer provided by an embodiment of the present disclosure.

An N-th metal line layer may include m common A-electrode pins and 3n common B-electrode pins. Each common A-electrode pin is electrically connected to a respective common A-electrode pad corresponding to the A-electrodes of the LED light-emitting chips of the pixel units in one row, and each common B-electrode pin is electrically connected to respective B-electrode pads corresponding to the B-electrodes of the LED light-emitting chips with the same light-emitting color of the pixel units in one column. FIG. 4 is a structural view of a fourth metal line layer provided by an embodiment of the present disclosure. Referring to FIG. 4, in this embodiment, the N-th metal line layer is a fourth metal line layer 40. Referring to FIG. 4, the fourth metal line layer 40 includes two common A-electrode pins and six common B-electrode pins. The two common A-electrode pins are a common A-electrode pin 401 in a first row and a common A-electrode pin 402 in a second row, and six common B-electrode pins which are a first common B-electrode pin 403A in a first column, a second common B-electrode pin 403B in the first column, a third common B-electrode pin 403C in the first column, a first common B-electrode pin 404A in a second column, a second common B-electrode pin 404B in the second column, and a third common B-electrode pins 404C in the second column.

In an embodiment, the common A-electrode pin 401 in the first row is electrically connected to the common A-electrode pad 102 corresponding to the A-electrodes 60A of the LED light-emitting chips of the pixel units P in the first row through a conductive via, and the common A-electrode pin 402 in the second row is electrically connected to the common A-electrode pad 102 corresponding to the A-electrodes 60A of the LED light-emitting chips in the pixel units P in the second row through a conductive via. The first common B-electrode pin 403A in the first column is electrically connected to the B-electrode pads 103 corresponding to the B-electrodes of the LED light-emitting chips with the first light-emitting color in the pixel units in the first column through a conductive via. The second common B-electrode pin 403B in the first column is electrically connected to the B-electrode pads 103 corresponding to the B-electrodes of the LED light-emitting chips with the second light-emitting color in the pixel units in the first column through a conductive via. The third common B-electrode pin 403C in the first column is electrically connected to the B-electrode pads 103 corresponding to the B-electrodes of the LED light-emitting chips with the third light-emitting color in the pixel units in the first column through a conductive via. The first common B-electrode pin 404A in the second column is electrically connected to the B-electrode pads 103 corresponding to the B-electrodes of the LED light-emitting chips with the first light-emitting color in the pixel units in the second column through a conductive via. The second common B-electrode pin 404B in the second column is electrically connected to the B-electrode pads 103 corresponding to the B-electrodes of the LED light-emitting chips with the second light-emitting color in the pixel units in the second column through a conductive via. The third common B-electrode pin 404C in the second column is electrically connected to the B-electrode pads 103 corresponding to the B-electrodes of the LED light-emitting chips with the third light-emitting color in the pixel units in the second column through a conductive via.

In an embodiment of the present disclosure, the common A-electrode pins and the common B-electrode pins are provided in the fourth metal line layer to transmit driving electrical signals to the A-electrodes and B-electrodes of the LED light-emitting chips on the first metal line layer 10 through the conductive vias, thereby solving the problem in the existing art that the size of the display unit group is difficult to be further reduced due to the limitation of the sizes of the pads and the metal traces, and increasing the integration level of the small-spacing LED while ensuing the circuit stability of the LED display unit group.

Each common A-electrode pin may be located between two columns of pixel units and be close to an edge of the LED display unit group. Referring to FIG. 4, the common A-electrode pin 401 in the first row and the common A-electrode pin 402 in the second row are located between the two columns of pixel units.

In the embodiment of the present disclosure, the LED light-emitting chips 60 are each a flip chip, and the A-electrodes and B-electrodes of the LED light-emitting chips 60 are fixed on the first metal line layer 10 through a conductive material (such as a conductive silver adhesive or a solder paste).

Connection line directions from the A-electrode to the B-electrode of two corresponding LED light-emitting chips in adjacent pixel units in the same row may be opposite. Referring to FIGS. 1 and 2, the connection line directions from the A-electrode 60A to the B-electrode 60B of two LED light-emitting chips 601 with the first light-emitting color of the adjacent pixel units P in the first row are opposite. Correspondingly, the connection line directions from the A-electrode 60A to the B-electrode 60B of two LED light-emitting chips 602 with the second light-emitting color of the adjacent pixel units P in the first row are opposite. The connection line directions from the A-electrode 60A to the B-electrode 60B of two LED light-emitting chips 602 with the third light-emitting color of the adjacent pixel units P in the first row are opposite. The connection line directions from the A-electrode 60A to the B-electrode 60B of two LED light-emitting chips 601 with the first light-emitting color of the adjacent pixel units P in the second row are opposite. Correspondingly, the connection line directions from the A-electrode 60A to the B-electrode 60B of two LED light-emitting chips 602 with the second light-emitting color of the adjacent pixel units P in the second row are opposite. The connection line directions from the A-electrode 60A to the B-electrode 60B of two LED light-emitting chips 602 with the third light-emitting color of the adjacent pixel units P in the second row are opposite.

The common A-electrode pad is integrally formed with the A-electrode pads. Referring to FIG. 3, in the pixel units in each row, the common A-electrode pad 101 is integrally formed with the A-electrode pads 102. The common A-electrode pad 101 is integrally formed with the A-electrode pads 102, thereby further solving the problem in the existing art that the size of the display unit group is difficult to be further reduced due to the limitation of the sizes of the pads and the metal traces, and thus increasing the integration level of the small-spacing LED while ensuing the circuit stability of the LED display unit group.

The first metal line layer may include M connection parts. The common A-electrode pads are U-shaped. Each common A-electrode pad is electrically connected to the connection part in the same row, and the connection parts are electrically connected to the common A-electrode pins through the conductive vias. Referring to FIGS. 3 and 4, the first metal line layer 10 includes 2 connection parts 101A. The common A-electrode pads 101 are U-shaped. Each common A-electrode pad 101 is electrically connected to the connection part 101A in the same row, and each connection part 101A is electrically connected to a respective common A-electrode pin through a conductive via D1. The common A-electrode pad 101 corresponding to the first row is electrically connected to the connection part 101A in the first row which is electrically connected to the common A-electrode pin 401 in the first row through the conductive via D1. The common A-electrode pad 101 corresponding to the second row is electrically connected to the connection part 101A in the second row which is electrically connected to the common A-electrode pin 402 in the second row through another conductive via D1. The conductive vias D1 penetrate the first metal line layer 10 to the fourth metal line layer 40.

The common A-electrode pads 101 may be U-shaped, where a U-shaped opening direction of the common A-electrode pad 101 in the first row is opposite to a U-shaped opening direction of the common A-electrode pad in an m-th row. Referring to FIG. 3, the common A-electrode pads 101 are U-shaped, where the U-shaped opening direction of the common A-electrode pad 101 in the first row is opposite to the U-shaped opening direction of the common A-electrode pad 101 in the second row.

Each pixel unit may include an LED light-emitting chip with a first light-emitting color, an LED light-emitting chip with a second light-emitting color, an LED light-emitting chip with a third light-emitting color, and three B-electrode pads which are in one-to-one correspondence with the three LED light-emitting chips with different light-emitting colors. The three B-electrode pads are a first B-electrode pad, a second B-electrode pad and a third B-electrode pad. Referring to FIGS. 1 and 3, each pixel unit includes an LED light-emitting chip 601 with a first light-emitting color, an LED light-emitting chip 602 with a second light-emitting color, an LED light-emitting chip 603 with a third light-emitting color, and three B-electrode pads 103 which are one-to-one correspondence with the three LED light-emitting chips with different light-emitting colors. The three B-electrode pads 103 are a first B-electrode pad 103A, a second B-electrode pad 103B and a third B-electrode pad 103C.

Figure 6:
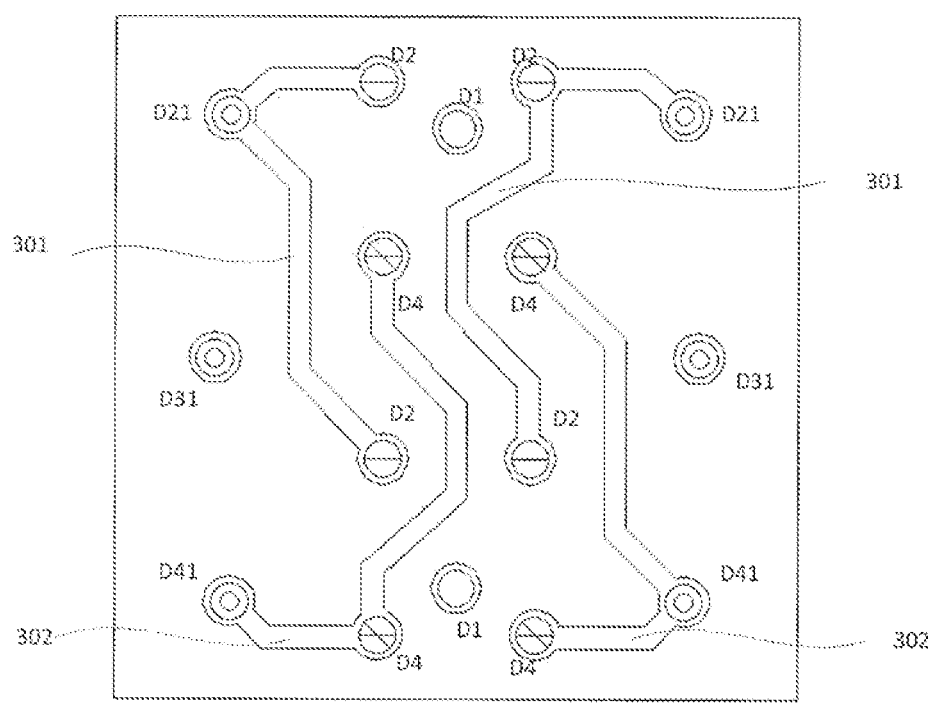
FIG. 6 is a structural view of a third metal line layer provided by an embodiment of the present disclosure.

In an embodiment, N=4, and a metal trace connecting the first B-electrode pads in the pixel units in each column and a metal trace connecting the third B-electrode pads in the pixel units in each column are located in the third metal line layer 30. FIG. 6 is a structural view of a third metal line layer provided by an embodiment of the present disclosure. Referring to FIGS. 4 and 6, N=4, and a metal trace connecting the first B-electrode pads 103A in the pixel units in each column and a metal trace connecting the third B-electrode pads 103C in the pixel units in each column are located in the third metal line layer 30. In an embodiment, the first B-electrode pads 103A in the first metal line layer 10 are electrically connected to conductive vias D2 penetrating the first metal line layer 10 to the third metal line layer 30. A first metal trace 301 is electrically connected to the conductive vias D2, and is also electrically connected to a conductive via D21 penetrating the third metal line layer 30 and the fourth metal line layer 40. The conductive via D21 corresponding to the pixel units in the first column is electrically connected to the first common B-electrode pin 403A in the first column in the fourth metal line layer 40. The conductive via D21 corresponding to the pixel units in the second column is electrically connected to the first common B-electrode pin 404A in the second column in the fourth metal line layer 40.

The third B-electrode pads 103C in the first metal line layer 10 are electrically connected to conductive vias D4. A third metal trace 302 is electrically connected to the conductive vias D4 penetrating the first metal line layer 10 through the third metal line layer 30, and is also electrically connected to a conductive via D41 penetrating the third metal line layer 30 and the fourth metal line layer 40. The conductive via D41 corresponding to the pixel units in the first column is electrically connected to the third common B-electrode pin 403C in the first column in the fourth metal line layer 40. The conductive via D41 corresponding to the pixel units in the second column is electrically connected to the third common B-electrode pin 404C in the second column in the fourth metal line layer 40.

In an embodiment, N=4, and a metal trace connecting the second B-electrode pads 103B in the pixel units in each column is located in a second metal line layer 20.

Figure 5:
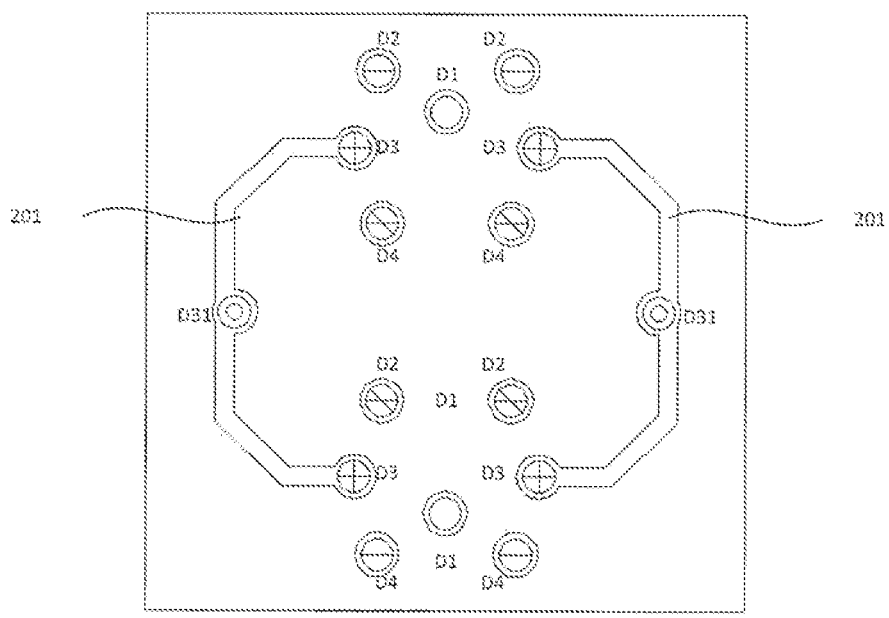
FIG. 5 is a structural view of a second metal line layer provided by an embodiment of the present disclosure.

FIG. 5 is a structural view of a second metal line layer provided by an embodiment of the present disclosure. Referring to FIGS. 4 and 5, the second B-electrode pads 103B in the first metal line layer 10 are electrically connected to conductive via D3 penetrating the first metal line layer 10 to the second metal line layer 20. A second metal trace 201 is electrically connected to the conductive vias D3, and is also electrically connected to a conductive via D31 penetrating the second metal line layer 20 to the fourth metal line layer 40. The conductive via D31 corresponding to the pixel units in the first column is electrically connected to the second common B-electrode pin 403B in the first column in the fourth metal line layer 40. The conductive via D31 corresponding to the pixel units in the second column is electrically connected to the second common B-electrode pin 404B in the second column in the fourth metal line layer 40.

An insulating plate in contact with the N-th metal line layer may be provided with an identifying marker for identifying the polarities of the pins.

Referring to FIG. 4, the insulating plate in contact with the fourth metal line layer is provided with an identifying marker for identifying the polarities of the pins. An insulating layer may be provided on a side of the fourth metal line layer facing away from the insulating plate. The material of the insulating layer includes white oil, resin, green oil or the like, serving for insulation and protection. The insulating layer includes two insulating materials with different colors, such as the white oil and the green oil. The boundary of the two insulating materials with different colors divides the insulating layer into two parts with different colors to form the identifying marker for identifying the polarities of the pins.

In an embodiment, an insulating layer (e.g., the white oil) is coated on the side of the fourth metal line layer facing away from the insulating plate, and then an insulating material (e.g., the green oil) whose color is of great difference from the color of the insulating layer may be coated on the surface of the insulating layer. The shape of the insulating material may be triangular or other shapes which can identify the polarities of the pins.

In an embodiment, the conductive vias electrically connected to the B-electrode pads corresponding to the LED light-emitting chips of each pixel unit is not in the same vertical line.

Referring to FIG. 3, a connection line of the conductive vias D2 and D3 and a connection line of the conductive vias D3 and D4 each form a certain included angle with the vertical direction, that is, the conductive vias D2, D3 and D4 are dislocated and are not in the same vertical line.

In the embodiment described above, the conductive via may be filled with the insulating material which does not exceed upper and lower surfaces of the circuit board. The insulating material includes the resin or the green oil, and the insulating material does not exceed the upper and lower surfaces of the circuit board. Such filling has the advantage of increasing the contact area between the package material and the circuit board in subsequently packaging the device, thereby increasing a bonding force between the package material and the circuit board and improving the sealing performance.

The conductive via in the embodiments of the present disclosure may also be replaced with a metal pillar (e.g., a copper pillar). A diameter of the metal pillar may be less than 0.2 mm. Bores s are drilled in the PCBs, and then copper electroplating and deposition is performed. Since the bore diameter is very small, the copper fills the bores and directly forms the copper pillars. The smaller the bore diameter is, the better the sealing performance of the device is.

In the above embodiments, ink layers are provided between pixel areas of adjacent rows as well as pixel areas of adjacent columns, and the ink layers may be made of black ink or other dark inks, and is formed by the ink-jet printing technology to improve the contrast of the device surface, thereby improving the fidelity of the display colors.

Based on the same concept, an embodiment of the present disclosure further provide a display panel. The display panel includes any of the LED display unit groups described in the above solutions. Therefore, the display panel provided by the embodiment of the present disclosure also has the beneficial effects described in the above embodiments, which will not be repeated here.

It is to be noted that the above are merely preferred embodiments of the present disclosure and the principles used therein. It is to be understood by those skilled in the art that the present disclosure is not limited to the embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A light-emitting diode (LED) display unit group, comprising:
   a circuit board, wherein the circuit board comprises N metal line layers stacked in sequence and an insulating plate located between adjacent metal line layers, and the N metal line layers are electrically connected through conductive vias in the insulating plate, wherein N≥2; and
   pixel units arranged in an array of m rows and n columns on the circuit board, wherein each of the pixel units comprises at least two LED light-emitting chips with different light-emitting colors, and the at least two LED light-emitting chips are fixed on a first metal line layer of the N metal line layers, wherein m≥2, and n≥2,
   wherein the first metal line layer comprises m common A-electrode pads, a plurality of A-electrode pads and a plurality of B-electrode pads; the plurality of A-electrode pads are in one-to-one correspondence with A-electrodes of all LED light-emitting chips; the plurality of B-electrode pads are in one-to-one correspondence with B-electrodes of all the LED light-emitting chips; and all A-electrode pads in the pixel units in each row are electrically connected to a respective one of the m common A-electrode pads;
   wherein ones of the plurality of A-electrode pads corresponding to LED light-emitting chips with a same light-emitting color in the pixel units in a same row are disposed to be bilaterally symmetric about a central axis of the circuit board in a vertical direction, and ones of the plurality of B-electrode pads corresponding to the LED light-emitting chips with the same light-emitting color in the pixel units in the same row are disposed to be bilaterally symmetric about the central axis of the circuit board in the vertical direction; and
   wherein each of the m common A-electrode pads is U-shaped, and a U-shaped opening direction of one of the m common A-electrode pads in a first row of the m rows is opposite to a U-shaped opening direction of one of the m common A-electrode pads in an m-th row of the m rows.

2. The LED display unit group of claim 1, wherein an N-th metal line layer of the N metal line layers comprises m common A-electrode pins and 3n common B-electrode pins, wherein each of the m common A-electrode pins is electrically connected to a respective one of the m common A-electrode pads corresponding to A-electrodes of LED light-emitting chips of the pixel units in one row, and each of the 3n common B-electrode pins is electrically connected to respective ones of the plurality of B-electrode pads corresponding to B-electrodes of LED light-emitting chips with a same light-emitting color of the pixel units in one column.

3. The LED display unit group of claim 2, wherein each of the m common A-electrode pins is located between two columns of the pixel units and is close to an edge of the LED display unit group.

4. The LED display unit group of claim 1, wherein connection line directions from an A-electrode to a B-electrode of LED light-emitting chips in two adjacent ones of the pixel units in the same row are opposite.

5. The LED display unit group of claim 1, wherein each of the m common A-electrode pads is integrally formed with respective ones of the plurality of A-electrode pads.

6. The LED display unit group of claim 2, wherein the first metal line layer comprises m connection parts, each of the m common A-electrode pads is electrically connected to a respective one of the m connection parts in a same row, and each of the m connection parts is electrically connected to a respective one of the m common A-electrode pins through one of the conductive vias.

7. The LED display unit group of claim 1, wherein each of the pixel units comprises an LED light-emitting chip with a first light-emitting color, an LED light-emitting chip with a second light-emitting color, an LED light-emitting chip with a third light-emitting color, and three B-electrode pads which are in one-to-one correspondence with the three LED light-emitting chips with different light-emitting colors, wherein the three B-electrode pads are a first B-electrode pad, a second B-electrode pad and a third B-electrode pad.

8. The LED display unit group of claim 7, wherein N=4, and a metal trace connecting first B-electrode pads in the pixel units in each column and a metal trace connecting third B-electrode pads in the pixel units in each column are located in a third metal line layer.

9. The LED display unit group of claim 7, wherein N=4, and a metal trace connecting second B-electrode pads in the pixel units in each column is located in a second metal line layer.

10. The LED display unit group of claim 2, wherein an insulating plate in contact with the N-th metal line layer is provided with an identifying marker for identifying polarities of the pins.

11. The LED display unit group of claim 1, wherein ones of the conductive vias electrically connected to B-electrode pads corresponding to the at least two LED light-emitting chips of each of the pixel units are not in a same vertical line.

12. A display panel, comprising a LED display unit group, wherein the LED display unit group comprises:
a circuit board, wherein the circuit board comprises N metal line layers stacked in sequence and an insulating plate located between adjacent metal line layers, and the N metal line layers are electrically connected through conductive vias in the insulating plate, wherein N≥2; and
pixel units arranged in an array of m rows and n columns on the circuit board, wherein each of the pixel units comprises at least two LED light-emitting chips with different light-emitting colors, and the at least two LED light-emitting chips are fixed on a first metal line layer of the N metal line layers, wherein m≥2, and n≥2,
wherein the first metal line layer comprises m common A-electrode pads, a plurality of A-electrode pads and a plurality of B-electrode pads; the plurality of A-electrode pads are in one-to-one correspondence with A-electrodes of all LED light-emitting chips; the plurality of B-electrode pads are in one-to-one correspondence with B-electrodes of all the LED light-emitting chips; and all A-electrode pads in the pixel units in each row are electrically connected to a respective one of the m common A-electrode pads;
wherein ones of the plurality of A-electrode pads corresponding to LED light-emitting chips with a same light-emitting color in the pixel units in a same row are disposed to be bilaterally symmetric about a central axis of the circuit board in a vertical direction, and ones of the plurality of B-electrode pads corresponding to the LED light-emitting chips with the same light-emitting color in the pixel units in the same row are disposed to be bilaterally symmetric about the central axis of the circuit board in the vertical direction; and
wherein each of the m common A-electrode pads is U-shaped, and a U-shaped opening direction of one of the m common A-electrode pads in a first row of the m rows is opposite to a U-shaped opening direction of one of the m common A-electrode pads in an m-th row of the m rows.

13. The display panel of claim 12, wherein an N-th metal line layer of the N metal line layers comprises m common A-electrode pins and 3n common B-electrode pins, wherein each of the m common A-electrode pins is electrically connected to a respective one of the m common A-electrode pads corresponding to A-electrodes of LED light-emitting chips of the pixel units in one row, and each of the 3n common B-electrode pins is electrically connected to respective ones of the plurality of B-electrode pads corresponding to B-electrodes of LED light-emitting chips with a same light-emitting color of the pixel units in one column.

14. The display panel of claim 13, wherein each of the m common A-electrode pins is located between two columns of the pixel units and is close to an edge of the LED display unit group.

15. The display panel of claim 12, wherein connection line directions from an A-electrode to a B-electrode of LED light-emitting chips in two adjacent ones of the pixel units in the same row are opposite.

16. The display panel of claim 12, wherein each of the m common A-electrode pads is integrally formed with respective ones of the plurality of A-electrode pads.

17. The display panel of claim 13, wherein the first metal line layer comprises m connection parts, each of the m common A-electrode pads is electrically connected to a respective one of the m connection parts in a same row, and each of the m connection parts is electrically connected to a respective one of the m common A-electrode pins through one of the conductive vias.

18. The display panel of claim 12, wherein each of the pixel units comprises an LED light-emitting chip with a first light-emitting color, an LED light-emitting chip with a second light-emitting color, an LED light-emitting chip with a third light-emitting color, and three B-electrode pads which are in one-to-one correspondence with the three LED light-emitting chips with different light-emitting colors, wherein the three B-electrode pads are a first B-electrode pad, a second B-electrode pad and a third B-electrode pad.

19. A light-emitting diode (LED) display unit group, comprising:
a circuit board, wherein the circuit board comprises N metal line layers stacked in sequence and an insulating plate located between adjacent metal line layers, and the N metal line layers are electrically connected through conductive vias in the insulating plate, wherein N≥2; and
pixel units arranged in an array of m rows and n columns on the circuit board, wherein each of the pixel units comprises at least two LED light-emitting chips with different light-emitting colors, and the at least two LED light-emitting chips are fixed on a first metal line layer of the N metal line layers, wherein m≥2, and n≥2,
wherein the first metal line layer comprises m common A-electrode pads, a plurality of A-electrode pads and a plurality of B-electrode pads; the plurality of A-electrode pads are in one-to-one correspondence with A-electrodes of all LED light-emitting chips; the plurality of B-electrode pads are in one-to-one correspondence with B-electrodes of all the LED light-emitting chips; and all A-electrode pads in the pixel units in each row are electrically connected to a respective one of the m common A-electrode pads;

wherein ones of the plurality of A-electrode pads corresponding to LED light-emitting chips with a same light-emitting color in the pixel units in a same row are disposed to be bilaterally symmetric about a central axis of the circuit board in a vertical direction, and ones of the plurality of B-electrode pads corresponding to the LED light-emitting chips with the same light-emitting color in the pixel units in the same row are disposed to be bilaterally symmetric about the central axis of the circuit board in the vertical direction;

wherein an N-th metal line layer of the N metal line layers comprises m common A-electrode pins and 3n common B-electrode pins, wherein each of the m common A-electrode pins is electrically connected to a respective one of the m common A-electrode pads corresponding to A-electrodes of LED light-emitting chips of the pixel units in one row, and each of the 3n common B-electrode pins is electrically connected to respective ones of the plurality of B-electrode pads corresponding to B-electrodes of LED light-emitting chips with a same light-emitting color of the pixel units in one column; and wherein the first metal line layer comprises m connection parts, each of the m common A-electrode pads is U-shaped and is electrically connected to a respective one of the m connection parts in a same row, and each of the m connection parts is electrically connected to a respective one of the m common A-electrode pins through one of the conductive vias.

* * * * *